United States Patent
Chuang et al.

(10) Patent No.: US 8,809,672 B2
(45) Date of Patent: Aug. 19, 2014

(54) NANONEEDLE PLASMONIC PHOTODETECTORS AND SOLAR CELLS

(75) Inventors: Chih-Wei Chuang, Albany, CA (US); Connie Chang-Hasnain, Palo Alto, CA (US); Forrest Grant Sedgwick, Berkeley, CA (US); Wai Son Ko, Menlo Park, CA (US)

(73) Assignee: The Regents of the University of California, Oakland, CA (US)

( * ) Notice: Subject to any disclaimer, the term of this patent is extended or adjusted under 35 U.S.C. 154(b) by 322 days.

(21) Appl. No.: 12/789,026

(22) Filed: May 27, 2010

(65) Prior Publication Data

US 2011/0146771 A1    Jun. 23, 2011

Related U.S. Application Data (60) Provisional application No. 61/181,494, filed on May 27, 2009.

(51) Int. Cl.
*H01L 31/06* (2012.01)
*H01L 31/18* (2006.01)

(52) U.S. Cl.
USPC ............. 136/255; 438/71; 977/762; 977/954; 977/720; 977/813; 977/825; 257/21

(58) Field of Classification Search
CPC ............ H01L 31/0352; H01L 31/1852; H01L 31/0735; H01L 31/109; H01L 31/0384; H01L 31/03529; H01L 51/4266; Y10S 977/70; Y10S 977/72
USPC .................. 136/255; 977/762, 813, 825, 723; 257/21; 438/72
See application file for complete search history.

(56) References Cited

U.S. PATENT DOCUMENTS

| | | |
|---|---|---|
| 6,441,298 B1 | 8/2002 | Thio |
| 7,635,905 B2 | 12/2009 | Kim, II |

(Continued)

FOREIGN PATENT DOCUMENTS

| | | | | |
|---|---|---|---|---|
| WO | WO 2007/001098 A1 * | 1/2007 | ..................... | 136/255 |
| WO | WO 2007/059961 A1 * | 5/2007 | ...................... | 257/43 |

OTHER PUBLICATIONS

Akasaki et al, Crystal Growth and Conductivity Control of Group III Nitride Semiconductors and Their Application to Short Wavelength Light Emitters, Sep. 1997, Japan Journal of Applied Phsyics, vol. 36, pp. 5393-5408.*

(Continued)

*Primary Examiner* — Jonathan Johnson
*Assistant Examiner* — Bethany Lambright
(74) *Attorney, Agent, or Firm* — Withrow & Terranova, P.L.L.C.

(57) ABSTRACT

The present disclosure provides a catalyst-free growth mode of defect-free Gallium Arsenide (GaAs)-based nanoneedles on silicon (Si) substrates with a complementary metal-oxide-semiconductor (CMOS)-compatible growth temperature of around 400° C. Each nanoneedle has a sharp 2 to 5 nanometer (nm) tip, a 600 nm wide base and a 4 micrometer (μm) length. Thus, the disclosed nanoneedles are substantially hexagonal needle-like crystal structures that assume a 6° to 9° tapered shape. The 600 nm wide base allows the typical micro-fabrication processes, such as optical lithography, to be applied. Therefore, nanoneedles are an ideal platform for the integration of optoelectronic devices on Si substrates. A nanoneedle avalanche photodiode (APD) grown on silicon is presented in this disclosure as a device application example. The APD attains a high current gain of 265 with only 8V bias.

28 Claims, 7 Drawing Sheets

(56) References Cited

U.S. PATENT DOCUMENTS

| | | | |
|---|---|---|---|
| 7,847,180 | B2 | 12/2010 | Argo et al. |
| 2006/0207647 | A1 | 9/2006 | Tsakalakos et al. |
| 2008/0006319 | A1 | 1/2008 | Bettge et al. |
| 2008/0105296 | A1* | 5/2008 | Samuelson et al. ............ 136/255 |
| 2008/0110494 | A1 | 5/2008 | Reddy |
| 2008/0157057 | A1* | 7/2008 | Kim ................................ 257/13 |
| 2008/0216892 | A1* | 9/2008 | Alivisatos et al. ............. 136/260 |
| 2010/0025673 | A1* | 2/2010 | Hu et al. ........................ 257/43 |
| 2010/0043873 | A1* | 2/2010 | Kim et al. ...................... 136/255 |
| 2010/0078055 | A1 | 4/2010 | Vidu et al. |
| 2010/0102380 | A1* | 4/2010 | Ohlsson et al. ................ 257/329 |
| 2010/0139770 | A1* | 6/2010 | Scher et al. .................... 136/261 |
| 2010/0212728 | A1* | 8/2010 | Hori et al. ...................... 136/255 |
| 2011/0146771 | A1 | 6/2011 | Chuang et al. |
| 2013/0330875 | A1 | 12/2013 | Chuang et al. |

OTHER PUBLICATIONS

Choi et al, Large Scale Synthesis of Hexagonal Pyramid Shaped ZnO Nanocrystals from Thermolysis of Zn-Oleate Complex, Jul. 15, 2005, The Journal of Physical Chemistry, vol. 109, pp. 14792-14794.*

Chuang, L.C., et al., "GaAs Nanoneedle Photodetector Monolithically Grown on a (III) Si Substrate by MOCVD,"paper CTuV4, Conference on Lasers and Electro-Optics (CLEO 2009), submitted Dec. 9, 2008, Baltimore, MD, May 31-Jun. 5, 2009, pp. 1-2.

Chuang, L.C., et al., "GaAs-Based Nanoneedle Light Emitting Diode and Avalanche Photodiode Monolithically Integrated on a Silicon Substrate," Nano Letters, vol. 11 No. 385, 2011 (published online Dec. 21, 2010), pp. 385-390.

Moewe, M., et al., "Growth Mechanisms and Crystallographic Structure of InP nanowires on lattice-mismatched substrates," Journal of Applied Physics, 104, 044313, Aug. 27, 2008, 4 pages.

Chuang, L.C., et al., "Critical diameter for III-V nanowires grown on lattice-mismatched substrates," Journal of Applied Physics, 90, 043115, Jan. 25, 2007, 3 pages.

Moewe, M., et al., "Atomically sharp catalyst-free wurtzite GaAs/AlGaAs nanoneedles grown on silicon," Journal of Applied Physics, 93, 023116, Jul. 16, 2008, 3 pages.

Moewe, M., et al., "Core-shell InGaAs/GaAs quantum well nanoneedles grown on silicon with silicon-transparent emission," Optics Express, vol. 17, Issue 10, Apr. 28, 2009, pp. 7831-7836.

Novikov, I.V., et al., "Channel polaritons," Physical Review B, vol. 66, Jun. 2002, 13 pages.

Pile, D.F.P, et al., "Channel plasmon-polariton in a triangular groove on a metal surface," Optics Letters, vol. 29, May 2004, pp. 1069-1071.

Maartensson, T., et al., "Epitaxial III-V Nanowires on Silicon," Nano Letters 4, Sep. 23, 2004, pp. 1987-1990.

Cao, G., et al., "Bias-dependent photocurrent of Hg1-XCdXTe photodiodes," Journal of Applied Physics, 98, 064504, Sep. 22, 2005, 4 pages.

Moewe, M., "Growth and Characterization of III-V Nanowires and Nanoneedles," Technical Report No. UCB/EECS-2009-100 (dissertation), Department of Electrical Engineering and Computer Sciences, University of California at Berkeley, Jul. 16, 2009, 96 pages.

Notice of Allowance for U.S. Appl. No. 13/738,215, mailed Oct. 28, 2013, 9 pages.

* cited by examiner

NANONEEDLE PLASMONIC PHOTODETECTORS AND SOLAR CELLS

RELATED APPLICATIONS

This application claims the benefit of provisional patent application Ser. No. 61/181,494, filed May 27, 2009, the disclosure of which is hereby incorporated herein by reference in its entirety.

GOVERNMENT RIGHTS

This invention was made with government funds under Contract No. HR0011-07-3-0002 awarded by DARPA. The U.S. Government has rights in this invention.

FIELD OF THE DISCLOSURE

The present disclosure relates to nano-sized transducers for converting light radiation into a photocurrent and/or photovoltage.

BACKGROUND OF THE DISCLOSURE

An important goal of the electronics industry is an integration of optoelectronic devices with silicon (Si) substrates through the use of traditional complementary metal-oxide-semiconductor (CMOS) fabrication techniques. It is particularly desirable to develop a means for monolithic heterogeneous integration of direct-bandgap III-V compound materials onto Si CMOS substrates. For example, many important and long-sought-after applications such as optical interconnections for integrated circuits, highly sensitive photodetectors, and highly efficient solar photovoltaic cells could be realized through such means.

Traditional thin-film growth of direct-bandgap III-V compound materials is not suitable for integration due to a high growth temperature above 600° C. and a high dislocation density when growing on Si. In an effort to make progress towards the goal of integrating optoelectronic devices with Si substrates there has been intense research directed at group III-V nanostructures grown on Si substrates using a vapor-liquid-solid (VLS) growth mode. However, while progress has been made in producing defect-free nanostructures on Si substrates at relatively low temperatures in the range of 430° C.-470° C., the use of metal catalysts such as gold (Au) raises concerns about fabricating such nanostructures using CMOS fabrication techniques. Additionally, small and fragile nanostructure footprints such as those of thin nanowires have made it difficult to fabricate group III-V nanostructures through the use of optical lithography and batch fabrication processes. Thus, there remains a need for optoelectronic devices that can be integrated on Si substrates through the use of traditional CMOS fabrication techniques or techniques that are compatible with Si substrates that contain nearly finished CMOS devices and circuits.

SUMMARY OF THE DISCLOSURE

The present disclosure provides a new growth mode that produces group III-V nanostructures by means of metal organic chemical vapor deposition (MOCVD). In particular, this disclosure provides a catalyst-free growth mode of defect-free Gallium Arsenide (GaAs)-based nanostructures on silicon (Si) substrates with a complementary metal-oxide-semiconductor (CMOS)-compatible growth temperature of around 400° C. The nanostructures are crystalline, having a pure wurtzite phase crystal structure that is free of zincblende phases. The absence of zincblende phases is atypical for GaAs crystalline structures. However, it is important to note that an entire nanostructure need not have a pure crystalline structure to be usable in accordance with the present disclosure. Instead, it is preferred that a p-n junction formed with a portion of a nanostructure be a single phase crystalline structure for better device performances.

An embodiment of the present disclosure is a photodetector that is fabricated using a nanostructure in the form of a nanoneedle as a base structure. Each nanoneedle preferably has a sharp 2 to 5 nanometer (nm) tip, a 600 nm wide base and a 4 micrometer (μm) length. Thus, the preferred nanoneedles are substantially hexagonal needle-like crystal structures that assume a 6° to 9° tapered shape. The 600 nm wide base allows the typical micro-fabrication processes, such as optical lithography, to be applied. However, it is important to note that nanoneedles that are suitable for applications such as photodetectors may be grown to have a wide range of taper angles. An exemplary taper angle range for the disclosed nanoneedles is from 1° to 30°.

Moreover, other nanostructure embodiments such as nanopillars, which are frustums of nanoneedles are also suitable as base structures for photodetectors. Therefore, nanoneedles and nanopillars are ideal platforms for the integration of optoelectronic devices on Si substrates. For example, the present disclosure provides a nanostructure-based photodetector that is highly efficient at converting light radiation into a photocurrent and/or a photovoltage. Other exemplary applications include, but are not limited to:

1. Photodetectors for optical interconnect applications for Si circuits.
2. Photodetectors for battery-powered applications due to the photodetectors' low bias voltages.
3. Solar cells on Si or other substrates, including flexible substrates.
4. Light emitters on Si or other substrates, including flexible substrates.
5. Opto-fluidic applications, since nanoneedles can be fabricated to have hollow shells.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION OF THE PREFERRED EMBODIMENTS

The embodiments set forth below represent the necessary information to enable those skilled in the art to practice the disclosure and illustrate the best mode of practicing the disclosure. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

In an embodiment of the present disclosure, a Gallium Arsenide (GaAs)-based nanoneedle photodetector is monolithically grown and processed on a silicon (Si) substrate using a complementary metal-oxide-semiconductor (CMOS)-compatible catalyst-free and low-temperature (400° C.) crystal growth technique. Due to the catalyst-free nature of the crystal growth technique, there is no metal contamination of either the Si substrate or the nanoneedle-basedphotodetector.

Figure 1:
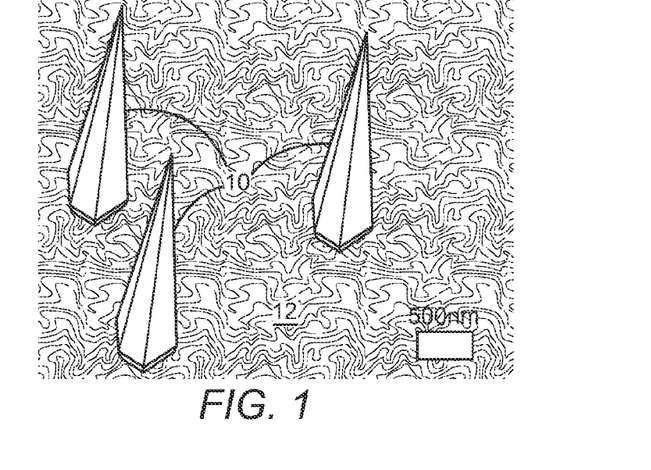
FIG. 1 depicts a line drawing of a 30° tilt scanning electron microscope (SEM) image of Gallium Arsenide (GaAs) nanoneedles grown on a silicon (Si) substrate.

FIG. 1 is a line drawing of a typical scanning electron microscope (SEM) picture of GaAs nanoneedles 10 grown on a Si substrate 12 by metal organic chemical vapor deposition (MOCVD) in accordance with the present disclosure. The nanoneedles 10 are initiated by spontaneous catalyst-free clustering and subsequently formed by an anisotropic sidewall plane deposition process. At a low growth temperature of around 400° C., a deposition rate is highly dependent on crystal orientation. As a result, each of the nanoneedles 10 is formed as a substantially hexagonal pyramid. In particular, the nanoneedles 10 exhibit a single wurtzite crystalline phase. One factor in the growth of the nanoneedles 10 is a crystal lattice mismatch between the nanoneedles 10 and the substrate 12. In this particular case, the substrate 12 has a crystalline structure in which Si atoms are spaced 4% closer together than group III-V atoms making up the nanoneedles 10. Other substrate materials and nanoneedle materials may have lattice mismatches that are different than that between GaAS atoms and Si atoms of 4% illustrated in this example.

Figure 2:
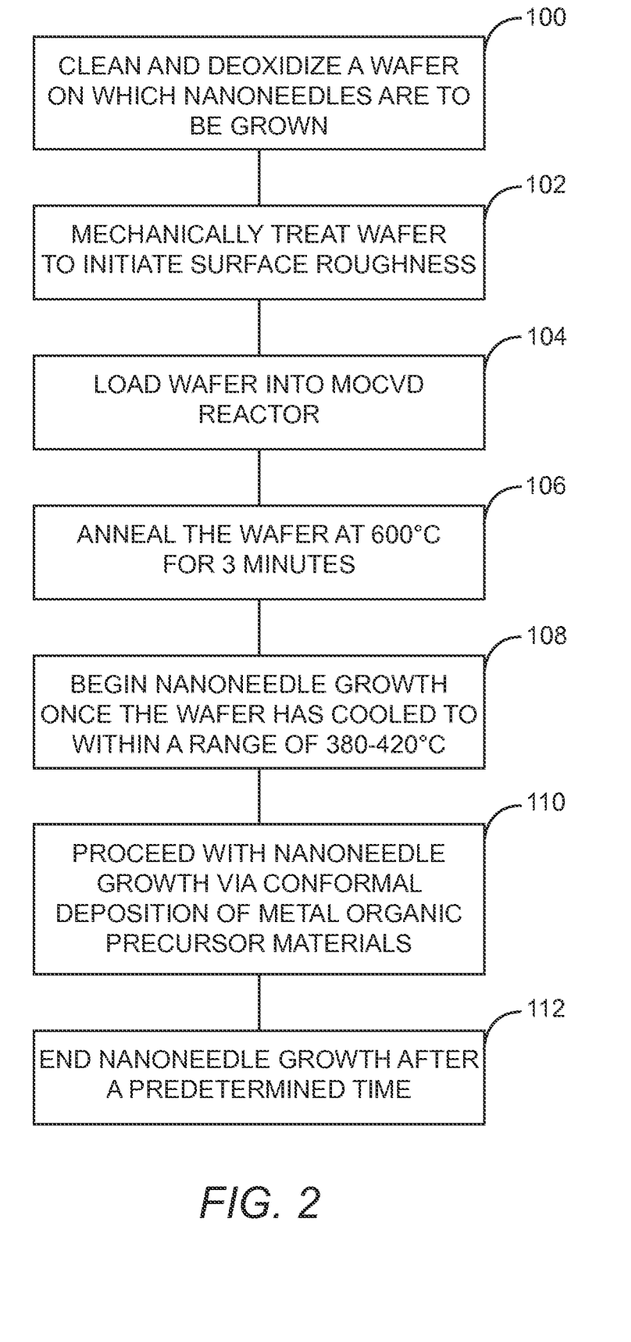
FIG. 2 is a flow chart illustrating the steps for growing nanoneedles according to the present disclosure.

FIG. 2 is a flow chart that depicts a process for growing the nanoneedles 10. The nanoneedles 10 are grown using an MOCVD reactor. A wafer onto which the nanoneedles 10 are to be grown is cleaned and deoxidized before growth (step 100). For GaAs, Si, or sapphire substrates, the wafer is first cleaned of organic contaminates by degreasing the wafer for 3 minutes in acetone, methanol, and then deionized water. If the wafer is made of GaAs, the wafer is deoxidized using a 50% hydrochloric acid (HCl) solution for 3 minutes, or until the surface becomes hydrophobic. A wafer made of Si is deoxidized in a 5:1 ratio of water and hydrogen fluoride ($H_2O$:HF) solution for 3 minutes. However, a wafer made of sapphire does not undergo any deoxidation processes, since sapphire itself, being made of aluminum oxide ($Al_2O_3$), is an oxide.

Next, if the wafer has GaAs or Si substrates, the wafer is mechanically treated to initiate surface roughness in order to catalyze three-dimensional (3D) GaAs island growth (step 102). However, the nanoneedle growth on sapphire substrates is spontaneous across the entire surface of the wafer, and does not require the mechanical roughening process.

Next, the wafer onto which the nanoneedles 10 are to be grown is loaded into the MOCVD reactor after deoxidation (step 104). The wafer is then annealed at 600° C. for 3 minutes (step 106). When the wafer cools to within a temperature range of 380° C.-420° C., the growth of the nanoneedles 10 may begin (step 108). A hydrogen carrier gas and a precursor species are passed over the hot wafer spinning at 1400 rpm, at a pressure of 76 torr. The hot wafer causes the precursor materials to react on the wafer surface, resulting in controlled growth of the nanoneedles. Two group III and V sources used for GaAs growth are triethylgallium (TEGa) and tertiarybutylarsine (TBA), which have relatively low decomposition temperatures of 300° C. and 380° C., respectively. These low decomposition temperatures allow for the low growth temperatures, which favor a 3D growth mode rather than typical MOCVD thin film growths at much higher temperatures that range near 600° C. Aluminum gallium arsenide (AlGaAs) and indium gallium arsenide (InGaAs) nanoneedle heterostructures, as well as bulk InGaAs nanoneedles, can be grown by adding trimethylaluminum (TMAl) and trimethylindium (TMIn). The nanoneedle growth proceeds via a conformal deposition of the metal-organic precursor material, with a higher growth rate along a c-axis tip of each of the nanoneedles 10 (step 110). The growth is linear, with the radius and c-axis growth rates being around 5 nm per minute and around 67 nm per minute, respectively. The growth process for the nanoneedles 10 is ended after a predetermined time that is based upon the growth rates and a desired size for the nanoneedles 10 (step 112). The nanoneedles 10 typically align to the <111> crystal directions on GaAs and Si. When growth of the nanoneedles 10 is conducted on GaAs having <111> surfaces and Si substrates having <111> surfaces, the nanoneedles 10 will typically grow perpendicular to the substrate surface. The nanoneedles 10 have a constant taper angle of 6-9° during growth.

A core and a shell of each of nanoneedles 10 may be made of gallium aluminum arsenide (GaAlAs) using sources that include trimethylaluminum (TMAl), triethylgallium (TEGa) and tertiarybutylarsine (TBA). Further still, a core and a shell of each of nanoneedles 10 may be made of indium gallium aluminum arsenide (InGaAlAs) using sources that include trimethylindium (TMIn), trimethylaluminum (TMAl), triethylgallium (TEGa) and tertiarybutylarsine (TBA).

Figure 3:
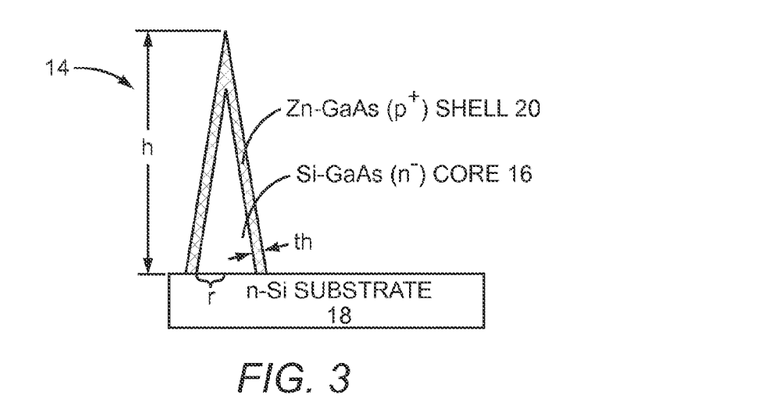
FIG. 3 is a cross-section diagram of a p-shell/n-core GaAs nanoneedle on an n-type Si substrate.

FIG. 3 is a cross-section diagram of a GaAs nanoneedle 14 according to the present disclosure. The GaAs nanoneedle 14 includes a core 16 made of Silicon-doped Gallium Arsenide (Si—GaAs (n⁻)) that has been grown on a substrate 18 made of n-type Si (n-Si). Nominally, the GaAs nanoneedle 14 has a core radius (r) of 250 nm and a height (h) of 4 µm. The Si—GaAs (n⁻) core 16 in encased by a p-shell 20 made of Zinc-doped Gallium Arsenide (Zn—GaAs (p⁺)), which forms a p-shell/n-core junction. The nominal shell thickness (th) of p-shell 20 is on the order of 50 nm.

The core 16 of the GaAs nanoneedle 14 is lightly Si-doped, having an n-type dopant density that is less than or equal to $10^{16}/cm^3$. In contrast, the p-shell 20 is heavily Zn-doped, having a p-type dopant density that is greater than or equal to $5*10^{17}/cm^3$.

Figure 4:
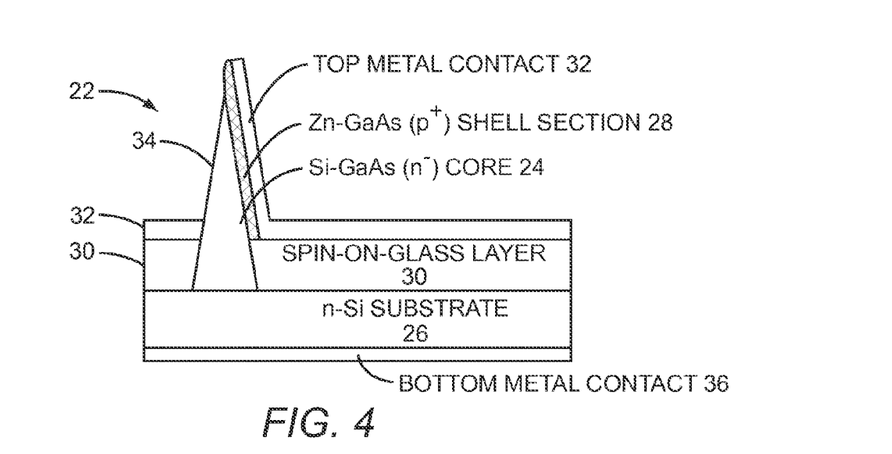
FIG. 4 is a cross-section diagram of a structure for a p-n GaAs nanoneedle-based photodetector device.

FIG. 4 is a cross-section diagram of a structure for a p-n GaAs nanoneedle-based photodetector device 22 according to the present disclosure. In particular, the photodetector device 22 is a nanoneedle avalanche photodiode (APD) grown on Si. The photodetector device 22 includes a core 24 made of Si-doped Gallium Arsenide (Si—GaAs (n⁻)) that has been grown on a substrate 26 made of n-type Si (n-Si). A shell section 28 made of Zn—GaAs (p⁺) forms a p-layer/n-core junction. Similar to the nanoneedles 10 (FIG. 1), the core 24 is in the form of a substantially hexagonal pyramid. The shell section 28 is a remaining portion of the p-shell 20 (FIG. 3) that has been partially etched away in a process that is detailed below. The shell section 28 preferably covers the top four-fifths of three contiguous sides of the core 24. The photodetector device 22 also includes an insulating layer such as a spin-on-glass layer 30 on top of the substrate 26. The insulating layer may also be made of benzocyclobutene (BCB). Preferably, the spin-on-glass layer 30 surrounds a lower portion of the core 24 and has a thickness that extends up to the lower extents of the shell section 28. A top metal contact 32 layer covers the shell section 28 and the spin-on-glass layer 30. The top metal contact 32 does not cover an exposed portion 34 of the core 24. A bottom metal contact 36 covers the substrate 26.

Figure 5:
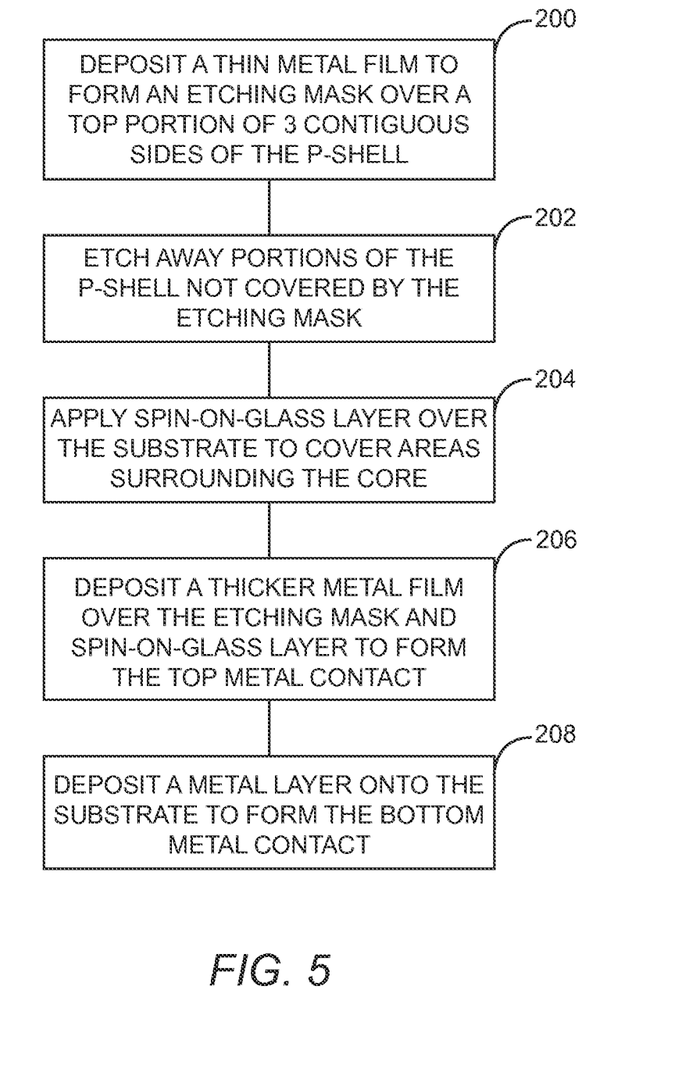
FIG. 5 is a flow chart illustrating the steps for fabricating a nanoneedle-based photodetector device according to the present disclosure.

The photodetector device 22 is fabricated using standard lithography and a metallization process. FIG. 5 depicts a flow chart for a process for fabricating the photodetector device 22 (FIG. 4) from the GaAs nanoneedle 14 (FIG. 3), which is used as a base form. The process for fabricating the photodetector device 22 preferably begins by depositing a thin titanium/gold (Ti/Au) film (~5/15 nm) onto a top portion of three contiguous sides of the p-shell 20 (step 200). Since only the top portions of three of the six sides making up the p-shell 20 are coated with the thin Ti/Au film, an angled electron beam (e-beam) evaporation method is the preferred method for the thin Ti/Au film deposition. The e-beam evaporation method is favored, due to its anisotropic deposition mode and its finer film deposition control. The Ti/Au film forms an etching mask to protect the p-type shell section 28 (FIG. 4). Next, a Zn—GaAs(p⁺) portion making up the lower portion of the p-shell 20 and the three sides of the core 16 without the Ti/Au etching mask is removed by etching (step 202). During this point in the process, the exposed portion 34 (FIG. 4) of the core 24 is realized.

Next, the spin-on-glass layer 30 (FIG. 4) is applied as a coating that is on the order of 2 μm thick to cover areas surrounding of the core 24 (FIG. 4) (step 204). The spin-on-glass layer 30 provides a template for the top metal contact 32 (FIG. 4). A thicker Ti/Au film (~10/120 nm) is deposited onto the spin-on-glass layer 30 and onto the thin metal etching mask covering the shell section 28 to form the top metal contact 32 (step 206). The exposed portion 34 of the core 24 is intentionally left uncoated to allow the absorption of photons. The bottom metal contact 36 (FIG. 4) is fabricated by depositing a relatively thick metal film (~300 nm) on a back side of the substrate 26 (step 208). The photodetector device 22 can be a cooperative one of a plurality of like photodetectors. In that case, it is preferable for the top metal contact 32 to be electrically connected to the top metal contacts of 30 to 50 other photodetectors that are fabricated on the same substrate 26.

The photodetector device 22 (FIG. 4) operates much like a traditional avalanche photodiode, which is an ultrasensitive type of light detector. However, unlike traditional avalanche photodiodes, which require a high external bias voltage to create a high electric field to amplify a number of electron-hole pairs formed upon photon absorption, the photodetector device 22 has an atomic arrangement that inherently forms a high electric field within the core 24 from the top metal contact 32 to the substrate 26. In operation of the photodetector device 22, the top metal contact 32 undergoes plasmonic oscillations that provide enhancement of electromagnetic radiation. Unique to the nanoneedle geometry of the photodetector device 22, a relatively large inherent electric field along the nanoneedle growth direction is attained which enables efficient sweeping of photo-generated carriers towards the contacts across the p-n junction. Also due to the unique geometry, a large avalanche gain is achieved with a small reverse bias. A very large current gain of 265 with 8 V reverse bias at room temperature may be achieved. Device characteristics of the photodetector device 22 are measured at room temperature. A linear photocurrent to irradiance response may be observed under a reasonable reverse bias voltage of 1 V.

Because the top contact of the device is deposited at an angle, a triangular "shadow" of missing metal extends out from the base of the core 24. Light impinging upon the shadow will excite a channel plasmon polariton mode, which can then propagate from the top surface of the metal, down through the shadow, and to the other surface. In this way, the shadow acts as a V-groove plasmon waveguide, with sub-diffraction confinement of the electric field and corresponding enhancement of intensity. The electric field of the mode penetrates the core 24, which is sitting in the "core" of the V-groove plasmon waveguide, and generates electron-hole pairs as it propagates. Thus, the shadow effectively increases the photon capture cross-section of the core 24. Additionally, localized surface plasmons (LSPs) are generated by the edges of the shadow and sharp features of the nanoneedle geometry of photodetector device 22. These LSPs may also excite channel polaritons within the shadow, creating additional enhancement of the photon capture cross-section.

Yet, another enhancement of the electric field is due to a lightning rod like effect created by the approximate curvature of the p-n junction between the shell section 28 and the core 24 of photodetector device 22. For example, for a nanoneedle with an approximated radius of curvature of ~300 nm, a depletion junction width is in the order of ~1 μm. As a result, a radius to depletion width ratio is only 0.3. A radius of depletion of 0.3 will create an electric field enhancement.

Figure 6:
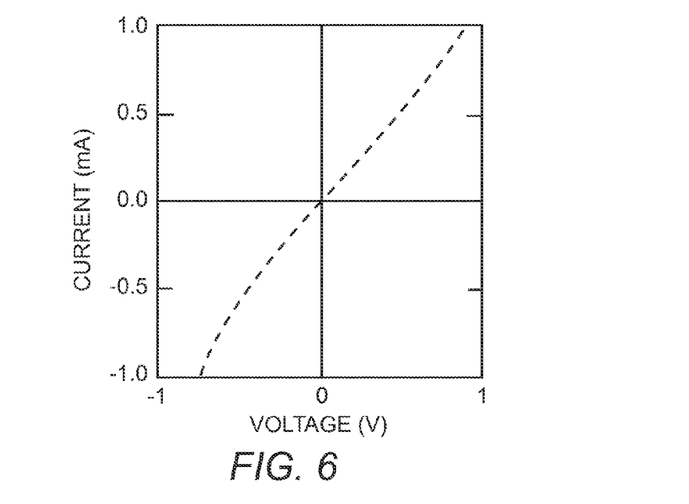
FIG. 6 depicts current and voltage (I-V) characteristics of a pure p-type nanoneedle sample grown on a p-type Si substrate.

Device characteristics are carried out at room temperature. FIG. 6 shows the I-V characteristics of a pure p-nanoneedle-on-p-Si sample with a linear I-V dependence indicating that excellent ohmic contacts are obtained.

Figure 7:
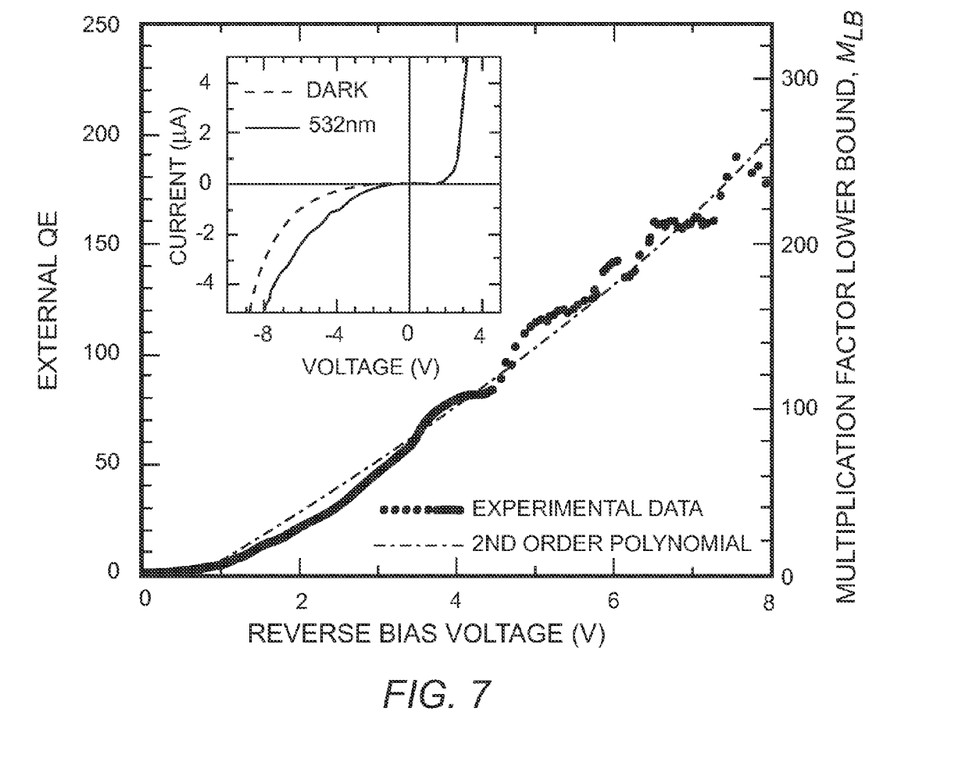
FIG. 7 depicts device characteristics pertaining to external quantum efficiency (QE) and estimated current multiplication factor lower bound ($M_{LB}$) as a function of bias voltage for a nanoneedle-based photodetector fabricated on a Si substrate. The inset is the corresponding current versus bias voltage plot for such a device.

FIG. 7 shows an external quantum efficiency (QE) and a current multiplication factor lower bound ($M_{LB}$, obtained by assuming internal quantum efficiency equal to one) as a function of bias voltage with a 2$^{nd}$ order polynomial fit shown in dashed line. The illumination was a 532 nm laser with 0.26 W/cm² irradiance. The $M_{LB}$ voltage dependence is substantially superlinear, in sharp contrast to the exponential dependence of conventional avalanche photodiodes (APDs). Furthermore, the gain is appreciable at very low voltages, reaching 29 at −2 V. Because power dissipation is the product of photocurrent and bias voltage, this reduction is vital for densely integrated devices where power and thermal budget are at a premium. At −8 V bias, the gain is as high as ~265. This amount of gain is exceedingly large compared to a state-of-the-art planar Ge/Si APD which has a gain of ~14 at −24 V, and a planar InGaAs/Si APD which has a gain of 100 at −24 V. The corresponding dark and the light I-V characteristics for photodetector device 22 are shown as the inset.

Figure 8:
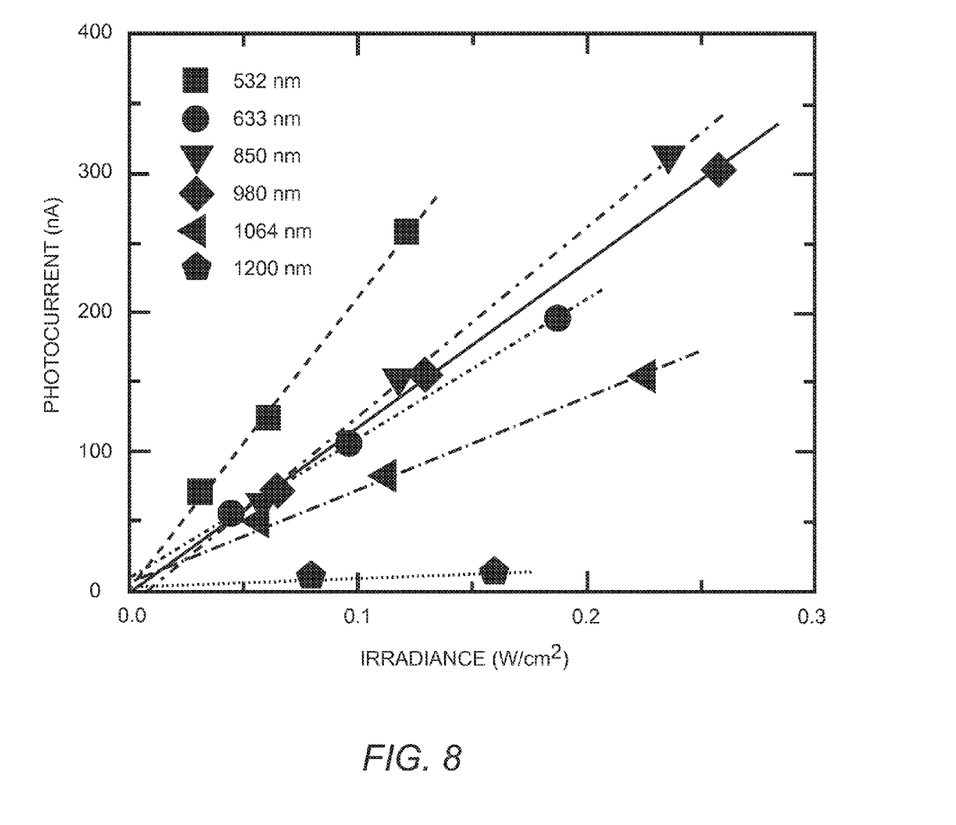
FIG. 8 depicts device characteristics pertaining to photocurrent as a function of the irradiance for several different illumination wavelengths.

FIG. 8 shows the photocurrent versus irradiance for various wavelengths for a device biased at −10V. A linear dependence is observed at all wavelengths over the irradiance range tested, indicating device operation in the linear regime. This linear dependence attests the high quality of the photodetector device 22, which is usable in demanding analog applications.

The external quantum efficiency for the photodetector device 22 may be estimated based on the irradiance, the photocurrent, and the size of the nanoneedle 14 that the photodetector device 22 is based upon. Experiments have shown that the external quantum efficiency for the photodetector device 22 is significantly greater than 100% at reverse bias voltages larger than 1 V.

As described above, the photodetector device 22 is based upon the nanoneedle 14 (FIG. 3), which has a GaAs p-n junction. The nanoneedle 14 is monolithically grown on a Si substrate with a CMOS-compatible growth temperature of around 400° C. Preferably, the Si substrate has a <111> surface. A linear response of the photocurrent to the irradiance can be obtained when the reverse bias voltage applied to the photodetector device 22 is at least −1V. The photodetector device 22 may be operated at room temperature. Moreover, a monolithic heterogeneous III-V to Si integration with CMOS compatibility may enable important applications such as on- or off-chip optical interconnects.

Further still, the photodetector device 22 (FIG. 4) may also be operated in reverse to convert voltage into photons. The composition of the core 24 (FIG. 4) and the shell section 28 (FIG. 4) or any additional new layers in between may be selected during fabrication of the photodetector device 22 to tune to specific wavelengths of light for emission or detection. The structure of the photodetector device 22 may also be adapted to become a laser diode.

Figure 9:
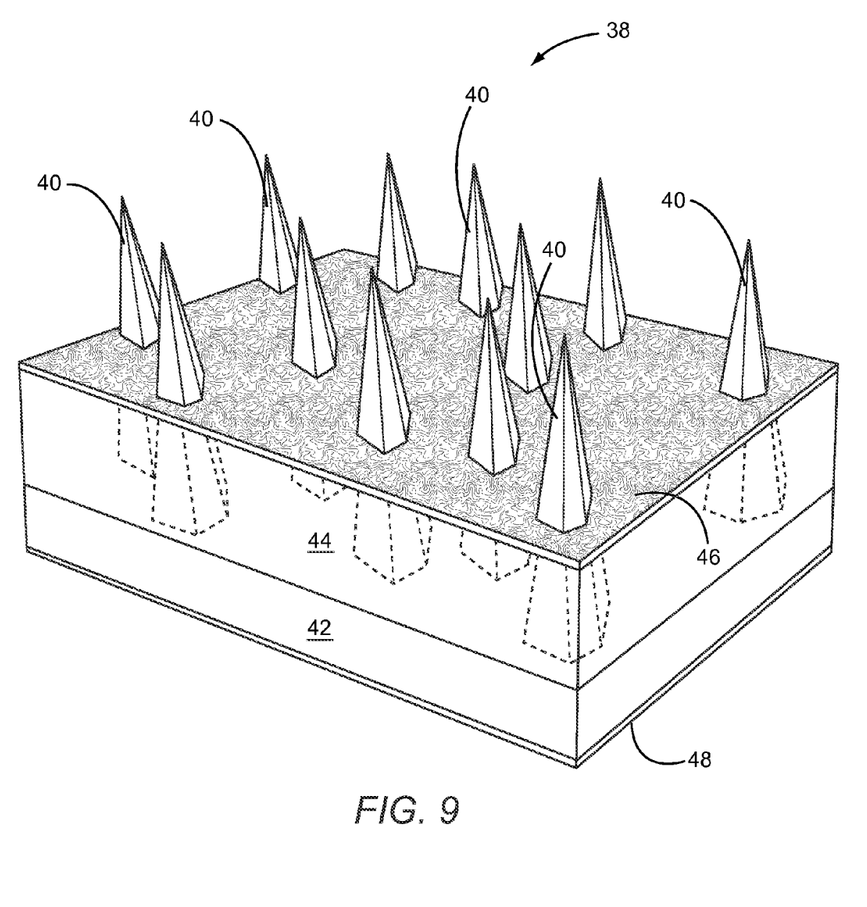
FIG. 9 depicts a plurality of nanoneedle devices configured to work together as a highly efficient solar cell.

FIG. 9 depicts a highly efficient solar cell 38 comprising a plurality of nanoneedle devices 40 having p-n junctions that are configured to source a photo-generated current to a load (not shown). The nanoneedle devices 40 are attached to a substrate 42. An insulation layer 44 applied to on top of the substrate 42 surrounds a lower portion of each of the nanoneedle devices 40. A top metallization layer 46 deposited over the insulation layer 44 electrically couples the nanoneedle devices 40 together. A bottom metallization layer 48 is deposited onto a bottom side of the substrate 42. As light radiation falls upon the nanoneedle devices 40, a potential difference develops between the top metallization layer 46 and the bottom metallization layer 48 due to an electron-hole separation inside each of the nanoneedle devices 40.

Figure 10:
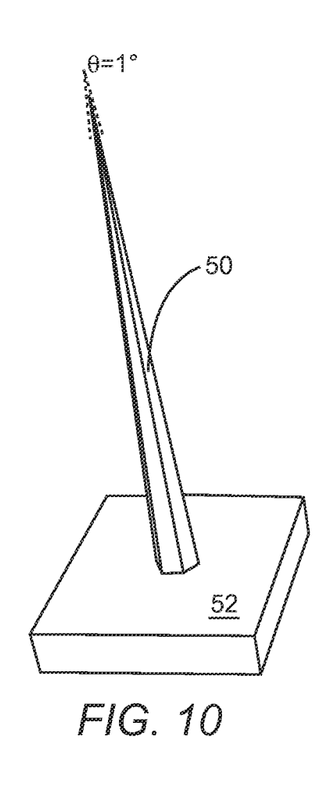
FIG. 10 depicts an ultra-sharp nanoneedle having a 1° tapered shape.
Figure 11:
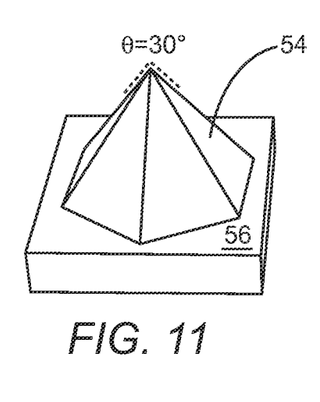
FIG. 11 depicts a broad nanoneedle having a 30° tapered shape.

FIGS. 10 and 11 illustrate a wide range of nanoneedle tapers. FIG. 10 depicts an ultra-sharp nanoneedle 50 that has been grown on a substrate 52. The nanoneedle 50 has a taper angle θ of 1°. FIG. 11 depicts a broadly tapered nanoneedle 54 that has been grown on a substrate 56. The nanoneedle 54 has a taper angle θ of 30°. Nanoneedles having taper angles between and including 1° and 30° are usable as base nanostructures for the fabrication of photodetector devices similar to the photodetector device 22 (FIG. 4).

Figure 12:
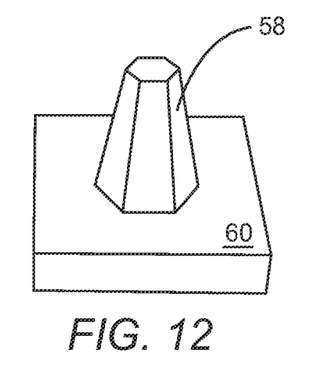
FIG. 12 depicts a nanopillar in accordance with the present disclosure.
Figure 13:
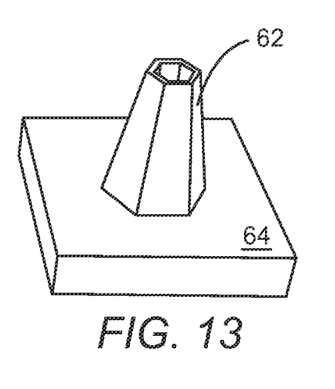
FIG. 13 depicts a hollow nanopillar in accordance with the present disclosure.

FIGS. 12 and 13 shows other embodiments of nanostructures that are in accordance with the present disclosure. In particular, FIG. 12 depicts a nanopillar 58 that has been grown on a substrate 60, while FIG. 13 depicts a nanopillar 62 that has been grown on a substrate 64. Both, the nanopillar 58 and the nanopillar 62 are usable as base nanostructures for the fabrication of photodevices similar to the photodetector device 22. However, the nanopillar device 62 is hollow after having a core etched away. As a result, the nanopillar device 62 is also usable as a base nanostructure for the fabrication of devices for opto-fluidic applications.

Those skilled in the art will recognize improvements and modifications to the preferred embodiments of the present disclosure. All such improvements and modifications are considered within the scope of the concepts disclosed herein and the claims that follow.

What is claimed is:

1. A photodetector device comprising:
a substrate;
a nanostructure having a hexagonal pyramid shaped core attached to and grown on the substrate, wherein the hexagonal pyramid shaped core has an exposed portion for absorbing photons;
a shell section deposited on a top portion of the hexagonal pyramid shaped core that is opposed to the exposed portion of the hexagonal pyramid shaped core, wherein the shell section creates a p-n junction with at least one face of the hexagonal pyramid shaped core;
a top metal contact deposited on at least one contiguous face of the shell section such that a triangular shadow extends out from a lower portion of the hexagonal pyramid shaped core; and
a bottom metal contact deposited on the substrate.

2. The photodetector device of claim 1 further including an insulating layer applied to the substrate surrounding the hexagonal pyramid shaped core.

3. The photodetector device of claim 1 wherein the hexagonal pyramid shaped core of the nanostructure is made of group III-V atoms.

4. The photodetector device of claim 3 wherein the substrate is made of silicon (Si).

5. The photodetector device of claim 4 wherein the silicon (Si) has a crystalline structure having a crystal lattice mismatch with the group III-V atoms making up the hexagonal pyramid shaped core of the nanostructure.

6. The photodetector device of claim 3 wherein the substrate is made of sapphire.

7. The photodetector device of claim 6 wherein the sapphire has a crystalline structure having a crystal lattice mismatch with the group III-V atoms making up the hexagonal pyramid shaped core of the nanostructure.

8. The photodetector device of claim 1 wherein the nanostructure is a nanoneedle.

9. The photodetector device of claim 8 wherein the nanoneedle has a taper angle range of 1° to 30°.

10. The photodetector device of claim 8 wherein the nanoneedle has a taper angle range of about 6° to 9°.

11. The photodetector device of claim 1 wherein the nanostructure is a nanopillar.

12. The photodetector device of claim 2 wherein the insulating layer has a thickness sufficient to cover at least one-half of the hexagonal pyramid shaped core of the nanostructure.

13. The photodetector device of claim 12 wherein the insulating layer is made of spin-on-glass.

14. The photodetector device of claim 12 wherein the insulating layer is made of benzocyclobutene (BCB).

15. A solar cell comprising:
a substrate;
a plurality of nanoneedle devices fabricated from nanostructures, each of the nanostructures having a hexagonal pyramid shaped core attached to and grown on the substrate, wherein each hexagonal pyramid shaped core has an exposed portion for absorbing photons;

a shell section deposited on a top portion of each hexagonal pyramid shaped core that is opposed to the exposed portion of each hexagonal pyramid shaped core, wherein each shell section creates a p-n junction with at least one face of each respective hexagonal pyramid shaped core;

a bottom metal contact deposited on the substrate; and a top metal contact deposited on at least one contiguous face of each shell section such that a triangular shadow extends out from a lower portion of each hexagonal pyramid shaped core.

16. The solar cell of claim 15 further including an insulating layer applied to the substrate and surrounding each hexagonal pyramid shaped core of the nanostructures.

17. The solar cell of claim 16 wherein the top metal contact is further deposited on the insulating layer to couple the plurality of nanoneedle devices together.

18. The solar cell of claim 15 wherein each hexagonal pyramid shaped core of the nanostructures are made of group III-V atoms.

19. The solar cell of claim 18 wherein the substrate is made of silicon (Si).

20. The solar cell of claim 19 wherein the silicon (Si) has a crystalline structure having a crystal lattice mismatch with the group III-V atoms making up the nanostructures.

21. The solar cell of claim 15 wherein the nanostructures are nanoneedles.

22. The solar cell of claim 21 wherein the nanoneedles each have a taper angle range of about 6° to 9°.

23. The solar cell of claim 16 wherein the insulating layer has a thickness sufficient to cover at least one-half of each hexagonal pyramid shaped core of the nano structures.

24. The solar cell of claim 16 wherein the insulating layer is made of spin-on-glass.

25. The solar cell of claim 16 wherein the insulating layer is made of benzocyclobutene (BCB).

26. The photodetector device of claim 1 wherein the hexagonal pyramid shaped core has a base width of at least on the order of 600 nm.

27. The photodetector device of claim 1 wherein the top metal contact deposited on at least one contiguous face of the shell section provides sub-diffraction confinement of an electric field that penetrates the hexagonal pyramid shaped core.

28. The solar cell of claim 15 wherein the top metal contact deposited on at least one contiguous face of the shell section provides sub-diffraction confinement of an electric field that penetrates the hexagonal pyramid shaped core.

* * * * *